US010642734B1

(12) United States Patent
Pillai

(10) Patent No.: US 10,642,734 B1
(45) Date of Patent: May 5, 2020

(54) NON-POWER OF TWO MEMORY CONFIGURATION

(71) Applicant: Advanced Micro Devices, Inc., Santa Clara, CA (US)

(72) Inventor: Pazhani Pillai, Tewksbury, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/208,139

(22) Filed: Dec. 3, 2018

(51) Int. Cl.
*G06F 12/06* (2006.01)
*G11C 16/06* (2006.01)
*G06F 13/16* (2006.01)

(52) U.S. Cl.
CPC .......... *G06F 12/0623* (2013.01); *G06F 13/16* (2013.01); *G06F 13/1647* (2013.01); *G06F 13/1657* (2013.01); *G06F 13/1684* (2013.01); *G11C 16/06* (2013.01); *G06F 2212/2532* (2013.01)

(58) Field of Classification Search
CPC ...................... G06F 12/00; G06F 13/16; G06F 2009/45583; G06F 12/0607; G06F 12/0831; G06F 13/1684; G06F 12/02
See application file for complete search history.

(56) References Cited

U.S. PATENT DOCUMENTS

| 8,051,253 | B2 | 11/2011 | Okin et al. |
| 8,914,568 | B2 | 12/2014 | Chinnaswamy et al. |
| 9,734,079 | B2 | 8/2017 | Feekes et al. |
| 10,521,003 | B2 | 12/2019 | Nachimuthu et al. |
| 2015/0089168 | A1* | 3/2015 | Kalyanasundharam ...... G06F 12/0607 711/157 |
| 2017/0262404 | A1* | 9/2017 | Liang ...................... G06F 13/16 |

* cited by examiner

*Primary Examiner* — Reginald G Bragdon
*Assistant Examiner* — Thanh D Vo
(74) *Attorney, Agent, or Firm* — Kowert Hood Munyon Rankin and Goetzel PC; Rory D. Rankin

(57) ABSTRACT

Systems, apparatuses, and methods for managing a non-power of two memory configuration are disclosed. A computing system includes at least one or more clients, a control unit, and a memory subsystem with a non-power of two number of active memory channels. The control unit reduces a ratio of the number of active memory channels over the total number of physical memory channels to a ratio of a first number to a second number. If a first subset of physical address bits of a received memory request are greater than or equal to the first number, the control unit calculates a third number which is equal to a second subset of physical address bits modulo the first number and the control unit uses a concatenation of the third number and a third subset of physical address bits to select a memory channel for issuing the received memory request.

20 Claims, 10 Drawing Sheets

FIG. 3

*Mod_ID[1:0] = (PA[11:10] == 3) ? PA[43:16] % 3 : PA[11:10]*
*CH_ID[3:0] = {Mod_ID[1:0], PA[9:8]}*

*Upper_bits[43:16] = (PA[11:10] == 3) ? (3 << (ADDR_SPACE-2)) : 0*
*NA[43:12] = Upper_bits[43:16] | PA[43:16]*
*NA[11:0] = {PA[15:12], PA[7:0]}*

*FIG. 7*

*REMAP_ID[2:0] = (3\*PA[43:16] + PA[12:10]) % 5*
*Mod_ID[2:0] = (PA[12:10] >= 5) ? REMAP_ID[2:0] : PA[12:10]*
*CH_ID[4:0] = {Mod_ID[2:0], PA[9:8]}*

*Upper_bits[43:16] = PA[12:10] << (ADDR64K_SPACE-3)*
*Lower_bits[43:16] = PA[43:16] & ((1 << (ADDR64K_SPACE-3)) – 1)*
*NA[43:11] = (PA[12:10] >= 5) ? (Upper_bits | Lower_bits) : PA[43:16]*
*NA[10:0] = {PA[15:13], PA[7:0]}*

*FIG. 10*

NON-POWER OF TWO MEMORY CONFIGURATION

BACKGROUND

Description of the Related Art

Modern processors and systems on chips (SoCs) include a variety of circuits and components to facilitate fast and efficient computation. Data movement energy between processors and memory is a large component of the total chip energy expended during program execution. A memory configuration typically has a power of two number of memory channels. This allows the address space to be mapped in a straightforward manner and for data to be transferred in efficient bursts between processing units and memory devices of the memory subsystem. As used herein, a "power of two memory configuration" is defined as a memory subsystem with a number of memory channels where the number is equal to a power of two. Examples of power of two numbers include 2, 4, 8, 16, 32, 64, 128, 256, 512, 1024, and so on.

However, cases exist where a computing system has a non-power of two memory configuration. As used herein, a "non-power of two memory configuration" is defined as a memory subsystem with a number of active memory channels where the number is not equal to a power of two. It is noted that for a "non-power of two memory configuration", the memory subsystem may actually have a number of physical memory channels where the number is equal to a power of two but where the number of resident memory slots is equal to a non-power of two number. In some cases, a physical memory slot is unoccupied or the slot is occupied by a non-functioning memory module or device. A physical memory channel that is connected to an occupied memory slot with a functioning and usable memory device is referred to as an "active memory channel".

BRIEF DESCRIPTION OF THE DRAWINGS

The advantages of the methods and mechanisms described herein may be better understood by referring to the following description in conjunction with the accompanying drawings, in which:

FIG. 3 is a diagram of one implementation of an address space mapping for a system with a non-power-of-two memory configuration.

FIG. 7 illustrates one implementation of pseudocode for selecting a memory channel and translating a physical memory address to a normalized address.

FIG. 10 illustrates another implementation of pseudocode for selecting a memory channel and translating a physical memory address to a normalized address.

DETAILED DESCRIPTION OF IMPLEMENTATIONS

Figure 1:
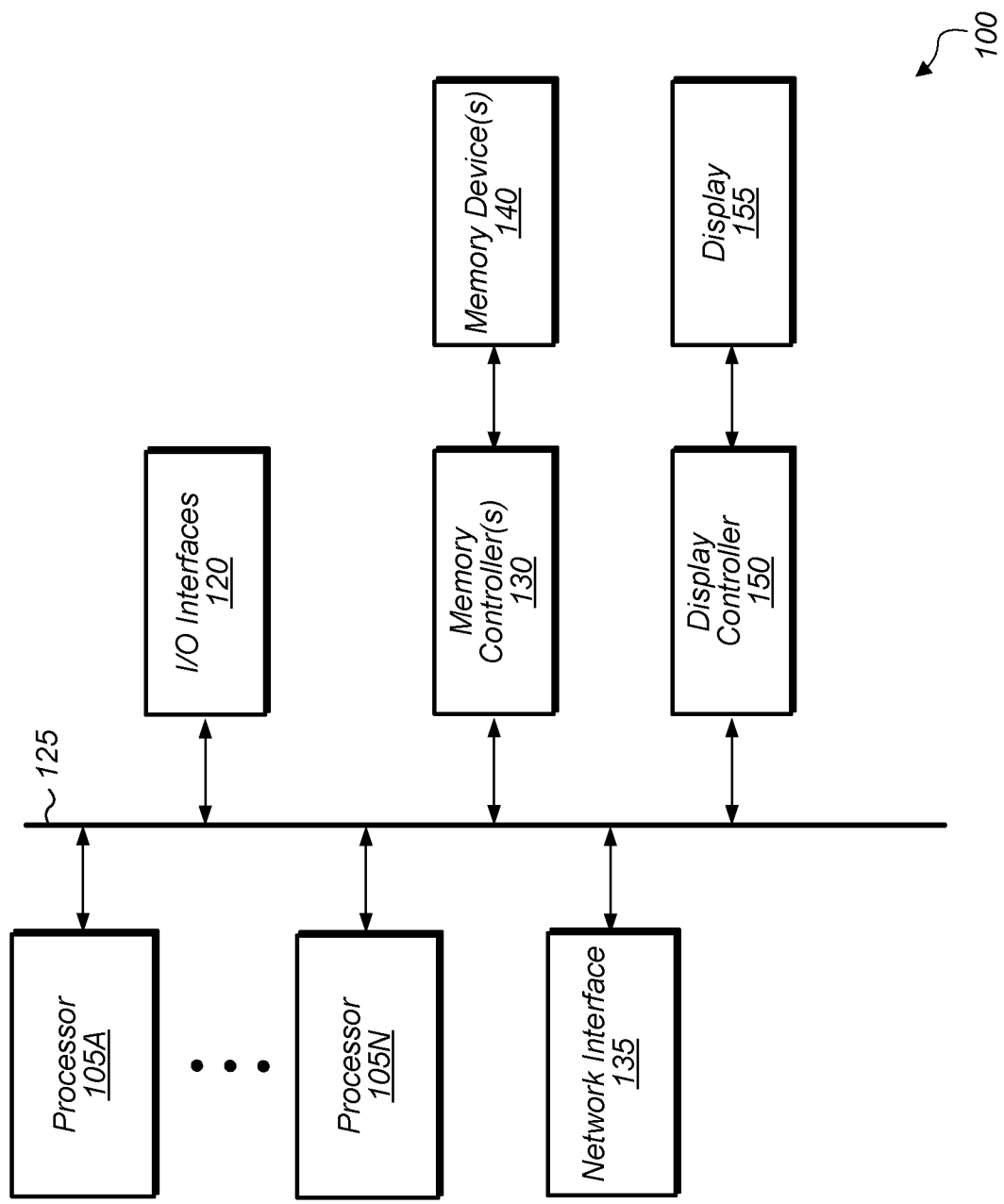
FIG. 1 is a block diagram of one implementation of a computing system.

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for managing a non-power of two memory configuration are disclosed herein. A computing system includes at least one or more clients, a control unit, and a memory subsystem with a non-power of two number of active memory channels. In one implementation, the control unit reduces a ratio of the number of active memory channels to the total number of physical memory channels down to a ratio of a first number to a second number. If a value (i.e., magnitude) of a first subset of physical address bits of a received memory request is greater than or equal to the first number, the control unit calculates a third number which is based on a value of a second subset of physical address bits (or a value corresponding to the subset of physical address bits) modulo the first number and the control unit uses a concatenation of a binary representation of the third number and a third subset of physical address bits to select a memory channel for issuing the received memory request. A value corresponding to the address bits may be a value based on a mathematical manipulation of the address bits or otherwise. In one implementation, the first subset of physical address bits are the physical address bits that determine if a non-active memory channel is being targeted by the received memory request. Then, the control unit completes the memory request to the selected memory channel. The first subset of physical address bits of the received memory request being greater than or equal to the first number indicates that the memory request would be targeting a non-active memory channel in a traditional addressing scheme. By selecting memory channels for issuing memory requests in this manner, the address space is striped across the non-power of two number of active memory channels in a manner which allows for efficient accesses to the memory subsystem by the one or more clients.

Additionally, in one implementation, if the value of the first subset of physical address bits of the received memory request is greater than or equal to the first number, then the control unit calculates a fourth number which is equal to the first subset of physical address bits shifted up by a fifth number, where the fifth number is calculated based on a size of an address space of the memory subsystem. As is known in the art, each upward bit shift results in a value equal to the previous binary value multiplied by two. Also, if the value of the first subset of physical address bits of the received memory request is greater than or equal to the first number, then the control unit calculates a first subset of normalized address bits as being equal to the second subset of physical address bits with upper bits being replaced by the first subset of physical address bits. Still further, if the value of the first subset of physical address bits of the received memory request are greater than or equal to the first number, then the control unit calculates a second subset of normalized address bits as being equal to a concatenation of a fourth subset of physical address bits and a fifth subset of physical address bits. Still further, if the value of the first subset of physical address bits of the received memory request are greater than or equal to the first number, then the control unit completes the memory request to a normalized address on the selected memory channel, where the normalized address includes the first subset of normalized address bits and the second subset of normalized address bits.

Referring now to FIG. 1, a block diagram of one implementation of a computing system 100 is shown. In one implementation, computing system 100 includes at least processors 105A-N, input/output (I/O) interfaces 120, bus 125, memory controller(s) 130, network interface 135, memory device(s) 140, display controller 150, and display 155. In other implementations, computing system 100 includes other components and/or computing system 100 is arranged differently. Processors 105A-N are representative of any number of processors which are included in system 100.

In one implementation, processor 105A is a general purpose processor, such as a central processing unit (CPU). In one implementation, processor 105N is a data parallel processor with a highly parallel architecture. Data parallel processors include graphics processing units (GPUs), digital signal processors (DSPs), field programmable gate arrays (FPGAs), application specific integrated circuits (ASICs), and so forth. In some implementations, processors 105A-N include multiple data parallel processors. In one implementation, processor 105N is a GPU which provides pixels to display controller 150 to be driven to display 155.

Memory controller(s) 130 are representative of any number and type of memory controllers accessible by processors 105A-N. Memory controller(s) 130 are coupled to any number and type of memory devices(s) 140. Memory device(s) 140 are representative of any number and type of memory devices. For example, the type of memory in memory device(s) 140 includes Dynamic Random Access Memory (DRAM), Static Random Access Memory (SRAM), NAND Flash memory, NOR flash memory, Ferroelectric Random Access Memory (FeRAM), or others.

I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices (not shown) are coupled to I/O interfaces 120. Such peripheral devices include (but are not limited to) displays, keyboards, mice, printers, scanners, joysticks or other types of game controllers, media recording devices, external storage devices, network interface cards, and so forth. Network interface 135 is used to receive and send network messages across a network.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components not shown in FIG. 1. Additionally, in other implementations, computing system 100 is structured in other ways than shown in FIG. 1.

Figure 2:
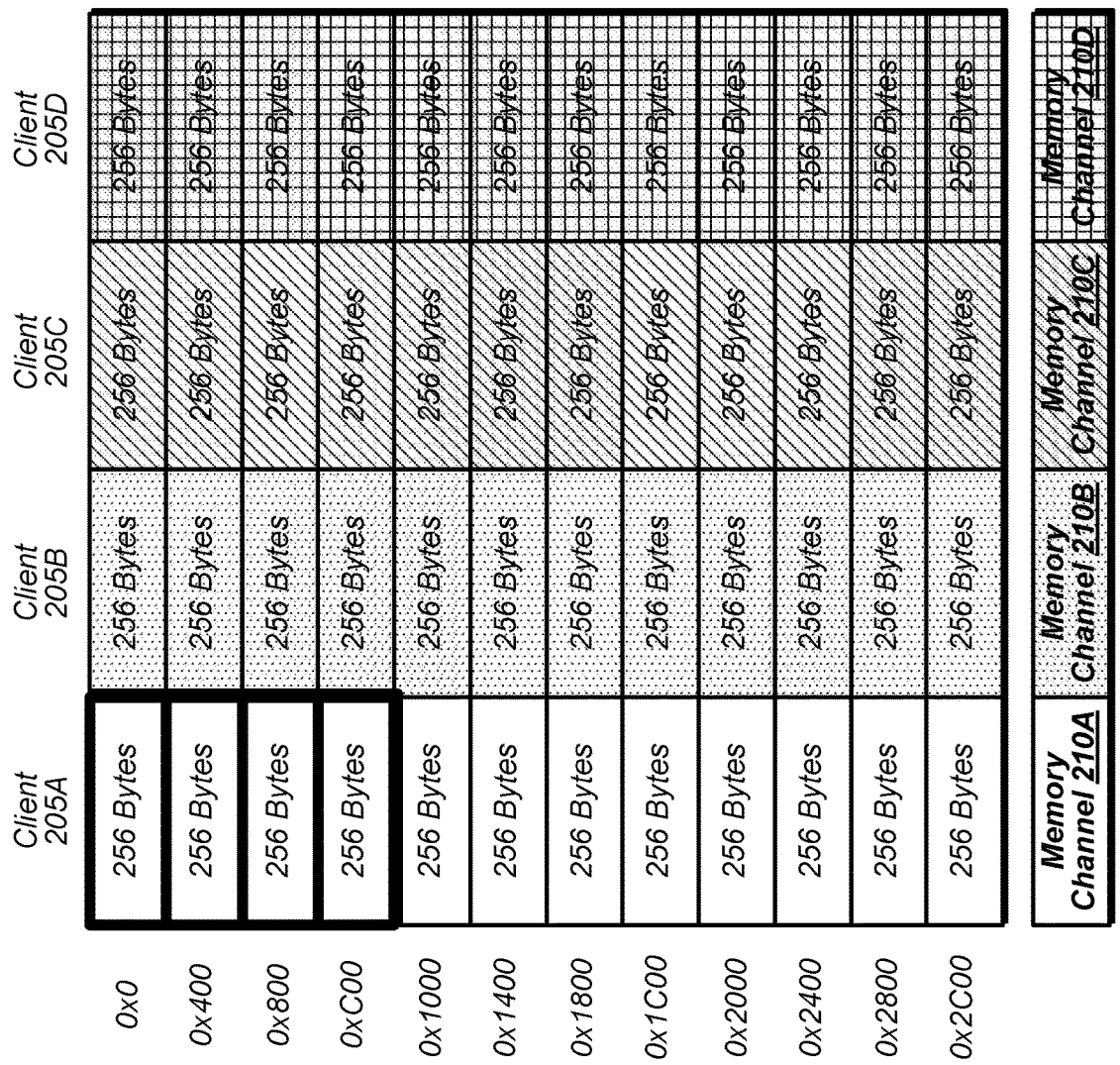
FIG. 2 is a diagram of one implementation of an address space mapping between clients and physical memory addresses for a power-of-two memory configuration.

Turning now to FIG. 2, a diagram of one implementation of an address space mapping 200 for a power-of-two memory configuration is shown. In one implementation, clients 205A-D access data in memory using a 256 byte stride across a power-of-two number of memory channels 210A-D. It is assumed for the purposes of this discussion that clients 205A-D access data in 1-kilobyte (KB) long bursts, usually within one memory channel, which is an efficient way to access memory for mapping 200. The math of striding the addressing to get efficient bursts is simple in systems which have a power of two memory configuration. A memory burst region is highlighted with bold outlines around the first four blocks in the column representing memory channel 210A under client 205A. In one implementation, clients 205A-D are render backends. In other implementations, clients 205A-D are other types of graphics engines. In further implementations, clients 205A-D are other types of non-graphics engines. In other implementations, other numbers of clients besides four can be mapped to memory channels 210A-D.

Mapping 200 illustrates one implementation of a mapping between clients 205A-D, physical memory addresses, and memory channels 210A-D for a power-of-two memory configuration. In one implementation, each client 205A-D has a one-to-one mapping to a corresponding memory channel 210A-D. It is assumed for the purposes of this implementation that the memory address space is mapped in blocks of 256 bytes in size. In other implementations, the memory address space is mapped in blocks of other sizes. For example, in one implementation, the four blocks highlighted for addresses 0x0, 0x400, 0x800, and 0xC00 for client 205A represent an efficient access burst to a single memory channel 210A by client 205A. The mapping of each client 205A-D to a separate memory channel 210A-D, respectively, is a simple configuration which makes for efficient accesses to memory. However, as will be illustrated in subsequent figures, non-power of two memory configurations typically result in inefficient accesses to memory.

Figure 3:
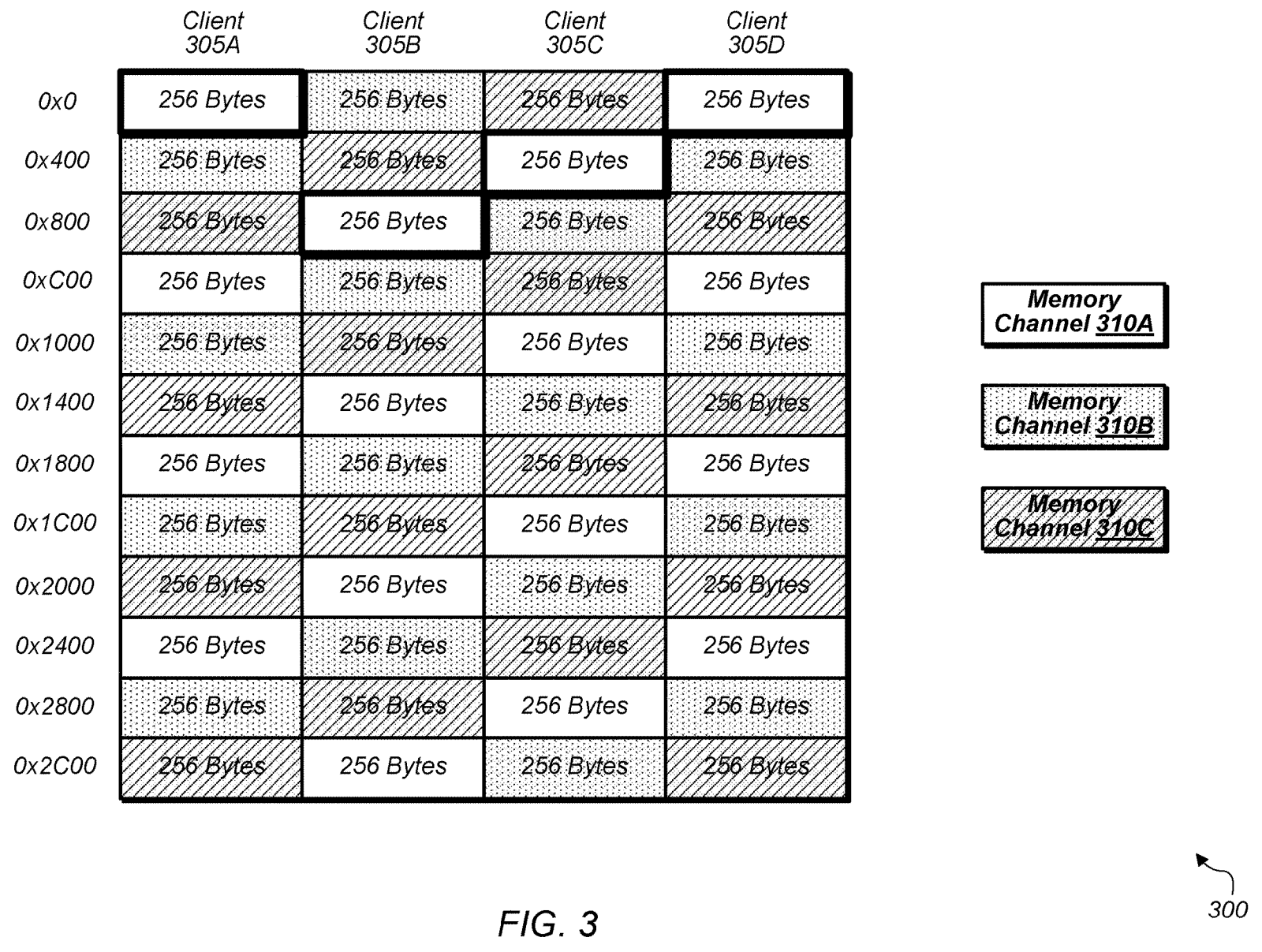

Referring now to FIG. 3, a diagram of one implementation of an address space mapping 300 for a system with a non-power of two memory configuration is shown. The mapping 300 of clients 305A-D to memory channels 310A-C shows a typical implementation for a prior art system with a non-power of two memory configuration. The mapping of data blocks to memory channels 310A-C is indicated by the shading of blocks shown on the right-side of FIG. 3. Accordingly, clear blocks without shading are mapped to memory channel 310A, blocks with dots are mapped to memory channel 310B, and blocks with diagonal lines are mapped to memory channel 310C. This mapping 300 results in inefficient accesses to memory channels 310A-C by clients 305A-D. For example, the highlighted blocks for memory channel 310A show how the first 1 kilobyte of data is mapped to memory channel 310A. Accordingly, the first 1 kilobyte of data mapped to memory channel 310A is not accessible in an efficient burst.

Figure 4:
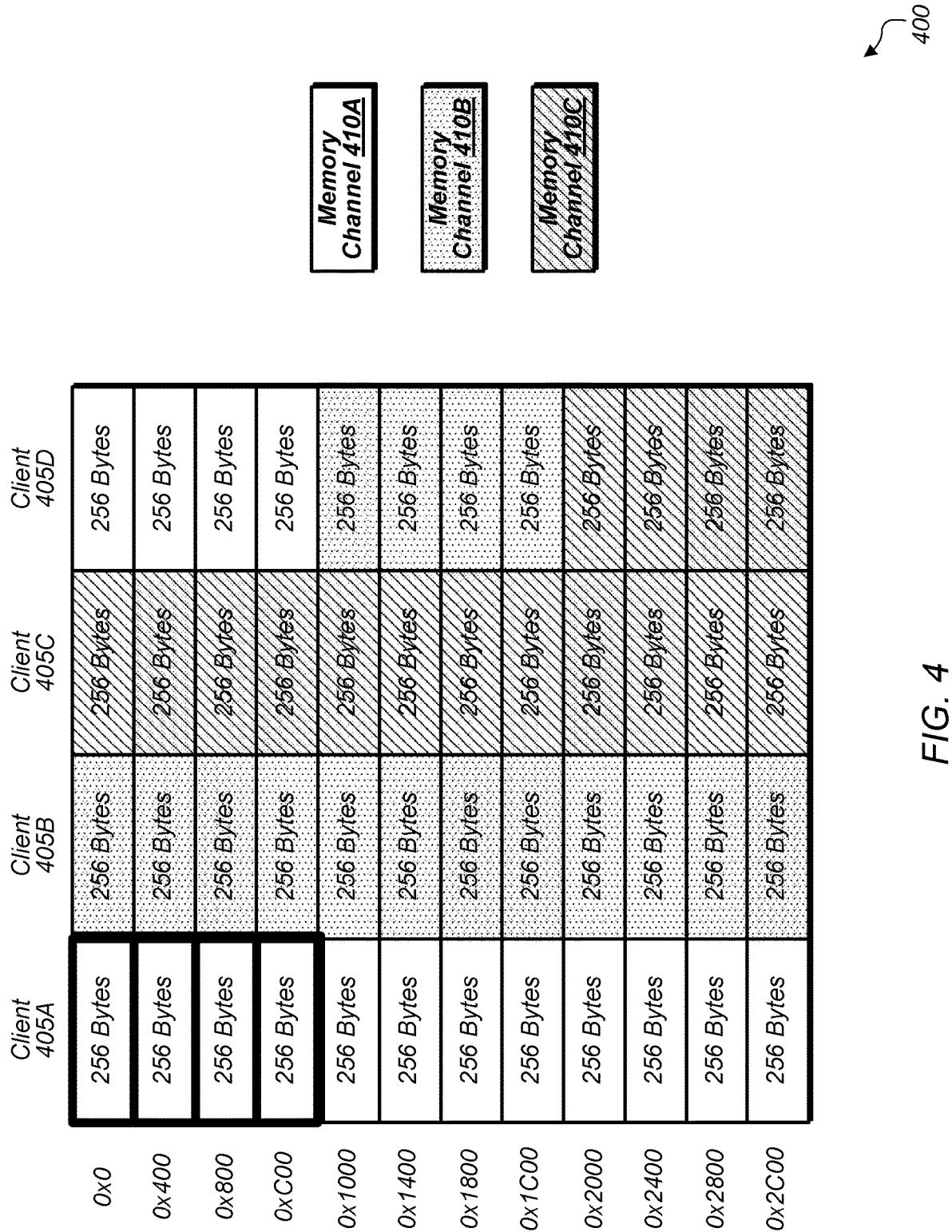
FIG. 4 is a diagram of another implementation of an address space mapping for a system with a non-power-of-two memory configuration.

Turning now to FIG. 4, a diagram of another implementation of an address space mapping 400 for a system with a non-power-of-two memory configuration is shown. Mapping 400 is an improved mapping compared to mapping 300

(of FIG. 3) for a system with a non-power-of-two memory configuration. The improvement of mapping 400 refers to the ability of each client 405A-D to perform an access across four blocks to the same memory channel. Since there are three memory channels 410A-C in the example system configuration, each memory channel 410A-C alternates being mapped to client 405D for four consecutive blocks. Similar to mapping 300, the mapping 400 of data blocks to memory channels 410A-C is indicated by the different shading of blocks shown on the right-side of FIG. 4.

As shown in mapping 400, after clients 405A-C are mapped to the three memory channels 410A-C in four-block chunks, client 405D is mapped to memory channel 410A for four blocks for addresses 0x300, 0x700, 0xB00, and 0xF00. Then, the next set of four-block chunks are mapped in the usual pattern from clients 405A-C to memory channels 410A-C. This is followed by client 405D being mapped to memory channel 410B for four blocks for addresses 0x1300, 0x1700, 0x1B00, and 0x1F00. Finally, after the next set of four-block chunks are mapped in the usual pattern to memory channels 410A-C for clients 405A-C, client 405D is mapped to memory channel 410C for the next four blocks for addresses 0x2300, 0x2700, 0x2B00, and 0x2F00. While client 405D continues with this mapping pattern by alternating between memory channels 410A-C, clients 405A-C continue to be mapped on a one-to-one basis to memory channels 410A-C, respectively. This pattern continues for the remainder of the memory address space. It is noted that mapping 400 represents one example of an efficient mapping for three memory channels and four clients. It should be understood that mapping 400 can be adjusted for use with other systems with other numbers of clients and/or other non-power of two numbers of memory channels.

Figure 5:
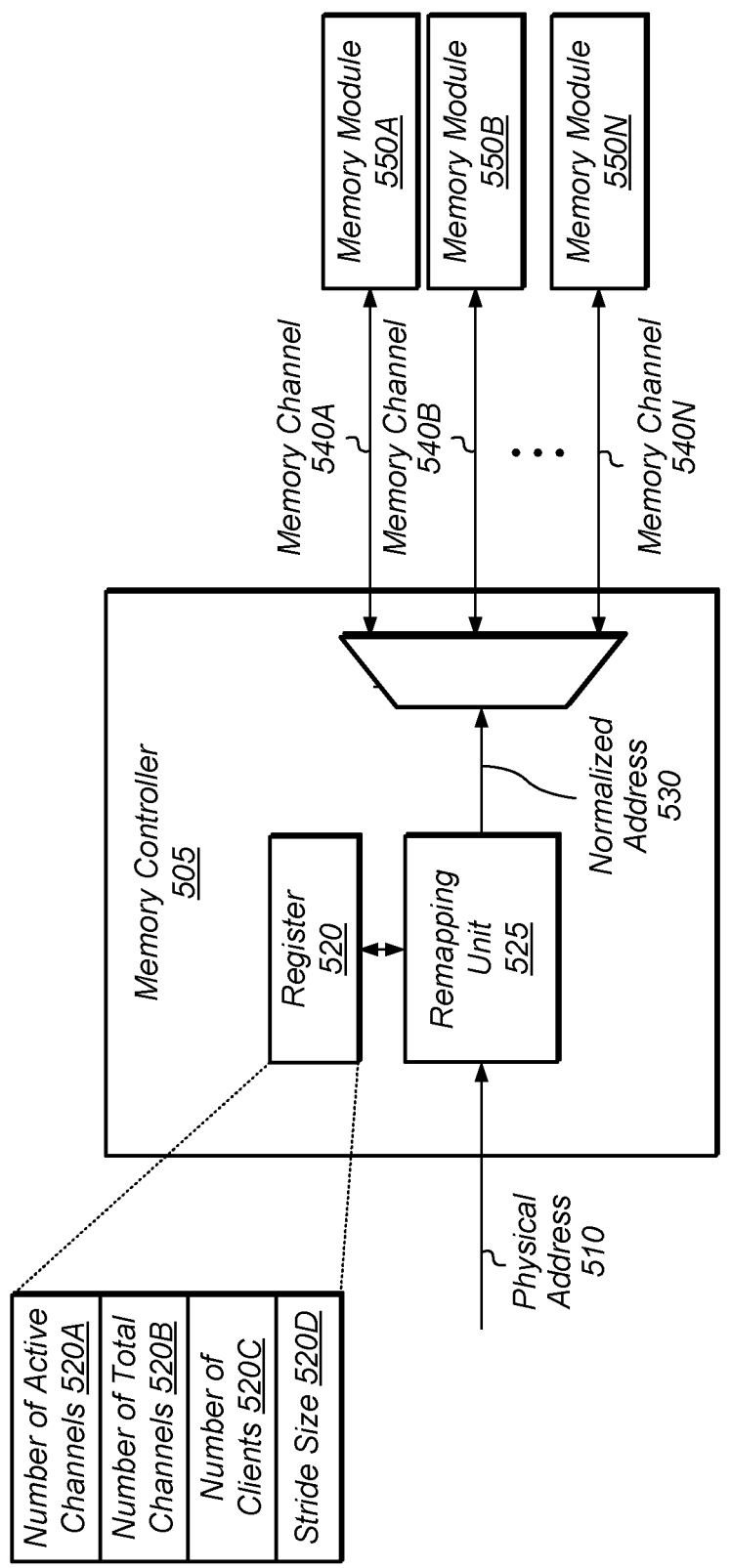
FIG. 5 is a block diagram of one implementation of a memory subsystem with a memory controller.

Referring now to FIG. 5, a block diagram of one implementation of a memory subsystem 500 with a memory controller 505 is shown. In one implementation, memory controller 505 includes at least register 520 and remapping unit 525. It is noted that memory controller 505 also includes other components and/or circuitry which are not shown to avoid obscuring the figure. In one implementation, register 520 includes values indicating the number of active memory channels 520A, the number of total memory channels 520B, the number of clients 520C, and the stride size 520D. In other implementations, register 520 includes other numbers and/or types of values. In further implementations, values 520A-D are stored in other locations.

In one implementation, remapping unit 525 receives a physical address 510 and converts the physical address 510 to a normalized address 530. In one implementation, the remapping is performed based on the number of active memory channels 540A-N indicated by register 520. This remapping helps to achieve a greater efficiency when accessing memory devices 550A-N via memory channels 540A-N. It is noted that remapping unit 525 can also be referred to herein as a "control unit". Memory channels 540A-N are representative of any number "N" of memory channels, with "N" being a non-power of two integer number. Each memory channel 540A-N connects to a corresponding memory module 550A-N. Each memory module 550A-N is implemented using any suitable type of memory technology (e.g., DRAM) and any number of memory devices.

Figure 6:
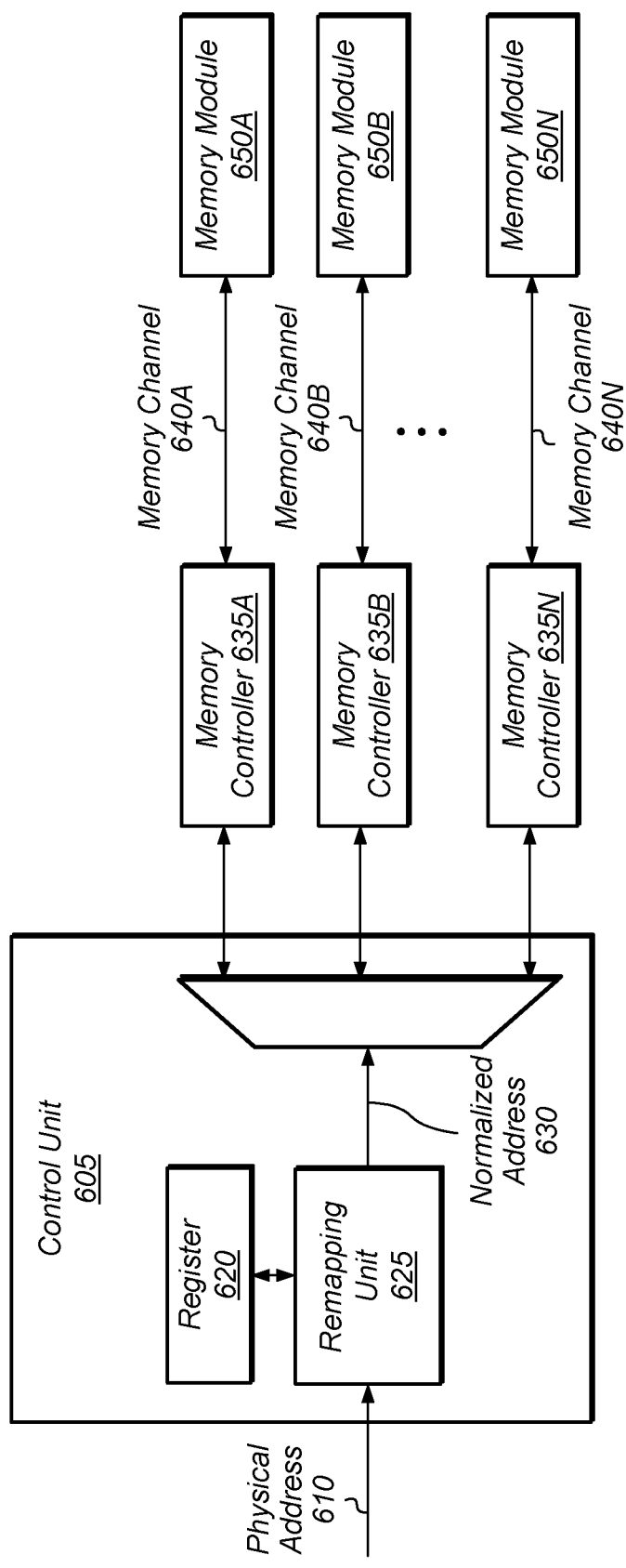
FIG. 6 is a block diagram of another implementation of a memory subsystem.

Turning now to FIG. 6, a block diagram of another implementation of a memory subsystem 600 is shown. In one implementation, control unit 605 includes at least register 620 and remapping unit 625. It is noted that control unit 605 also includes other components and/or circuitry which are not shown to avoid obscuring the figure. In one implementation, control unit 605 is located within an input/output (I/O) fabric unit. In other implementations, control unit 605 is positioned in other locations. In one implementation, remapping unit 625 receives a physical address 610 of a memory request and converts the physical address 610 to a normalized address 630 based on the number of active memory channels 640A-N. The remapping is performed based on the number of active memory channels 640A-N indicated by register 620. This remapping helps to achieve a greater efficiency when accessing memory modules 650A-N via memory channels 640A-N. Memory channels 640A-N are representative of any number "N" of memory channels, with "N" being a non-power of two integer number.

Referring now to FIG. 7, one implementation of pseudo-code 700 for selecting a memory channel and translating a physical memory address to a normalized address is shown. It is assumed for the purposes of pseudocode 700 that there are three active memory channels in the memory subsystem. Or said another way, it is assumed for pseudocode 700 that the ratio of the number of active memory channels in the memory subsystem to the total number of physical memory channels, after reduction of the ratio, has a numerator of three. Accordingly, in this implementation, the first line of pseudocode 700 checks to see if the physical address bits [11:10] are equal to 3, with 3 being the number of active memory channels. In one implementation, the term "active memory channel" is defined as an active memory channel that is connected to a fully-populated, fully-functional memory module or memory device. On the other hand, a "non-active memory channel" is defined as a memory channel coupled to less than a fully-populated memory module.

The first line of pseudocode 700 sets the mod_ID bits [1:0] to either the physical address bits [43:16] modulo 3 or to the physical address bits [11:10] depending on if the physical address bits [11:10] are equal to 3. In the second line of pseudocode 700, the channel ID bits [3:0] are set to a concatenation of the mod_ID bits [1:0] and the physical address bits [9:8]. The channel ID bits [3:0] select on which memory channel to route a received memory request, with the maximum number of memory channels being 16 for this particular implementation. In other implementations, the number of channel ID bits can vary according to the maximum number of supported memory channels.

The bit-array upper_bits [43:16] stores either the value of three shifted up by the variable (addr_space−2) or 0 depending on whether the physical address bits [11:10] are equal to 3. In one implementation, the variable addr_space is equal to the total amount of addressable physical memory in the system in given units, with the given units specified as a particular size. In one implementation, the given unit is 64 KB in size. In other implementations, the given unit is any of various other sizes. The bits [43:12] of the normalized address are set equal to the result of a bitwise-OR operation between the bit-array upper_bits [43:16] and the physical address bits [43:16]. The bits [11:0] of the normalized address are set equal to the concatenation of the physical address bits [15:12] and the physical address bits [7:0]. It should be understood that the example pseudocode 700 is indicative of code that can be used in one particular implementation. The sizes of the various bit-arrays and the specific bits within the physical address that are used within pseudocode 700 can vary for other implementations. The sizes of the various bit-arrays and the specific bits within the physical address that are used can vary according to the total address space, stride size, block size, number of active memory channels, number of physical memory channels, and so on.

Figure 8:
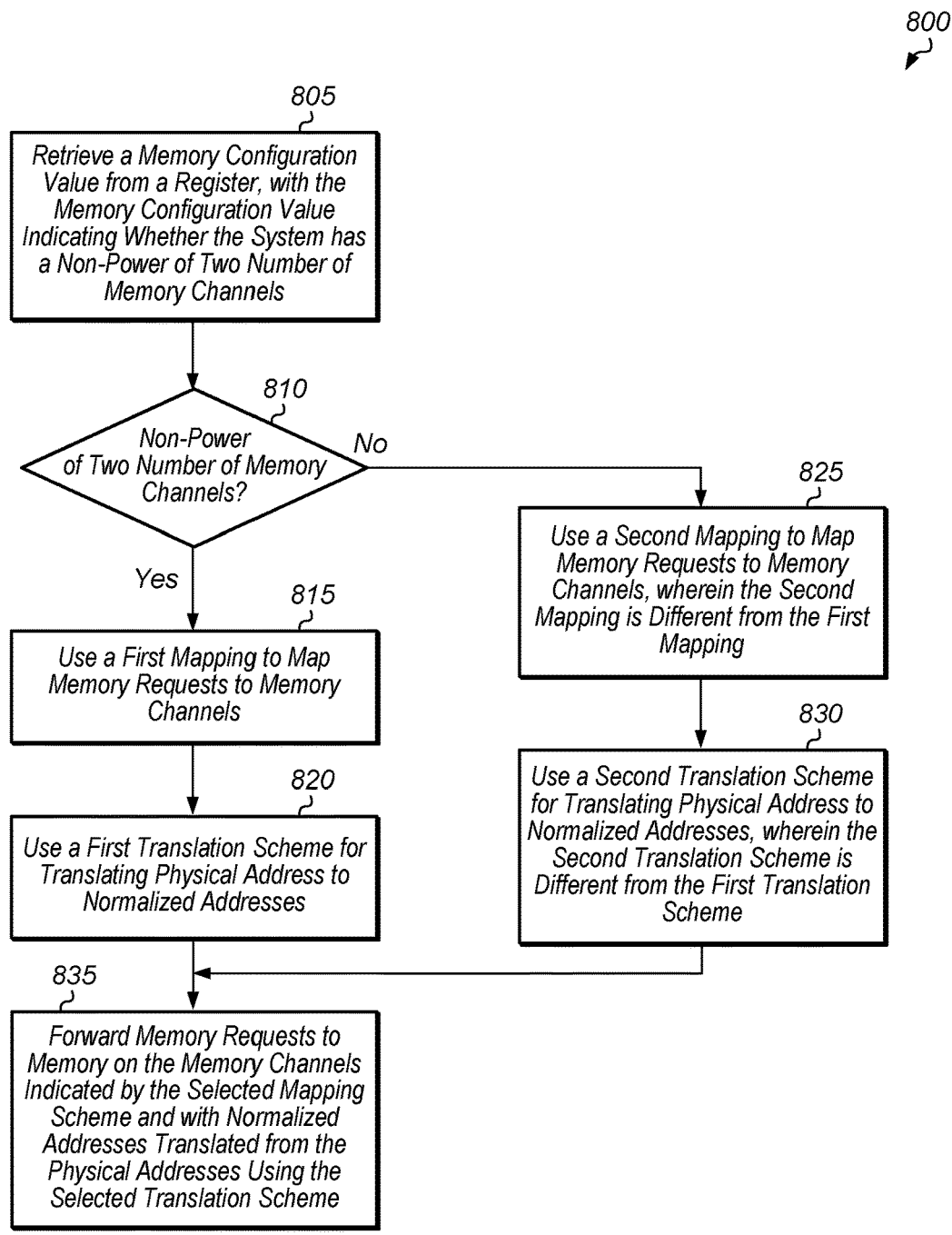
FIG. 8 is a generalized flow diagram illustrating one implementation of a method for determining a type of mapping scheme and address translation scheme to use for memory requests.
Figure 9:
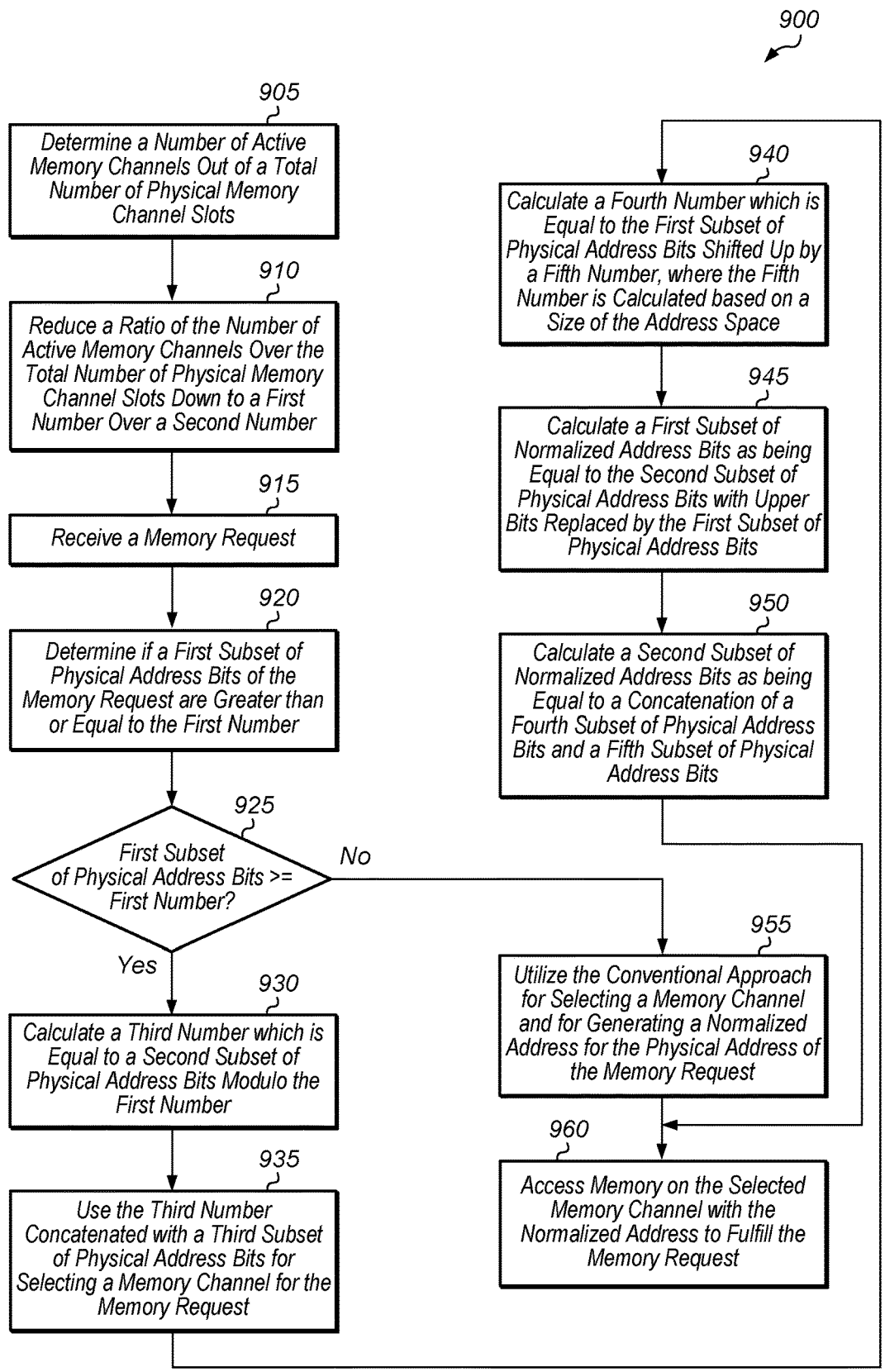
FIG. 9 is a generalized flow diagram illustrating one implementation of a method for selecting a memory channel for a given physical address for a non-power of two memory configuration.

Turning now to FIG. 8, one implementation of a method 800 for determining a type of mapping scheme and address translation scheme to use for memory requests is shown. For purposes of discussion, the steps in this implementation and those of FIG. 9 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 800.

A control unit retrieves a memory configuration value from a register, with the memory configuration value indicating whether the system has a non-power of two number of memory channels (block 805). In one implementation, block 805 is performed on system power-up. In other implementations, the memory configuration value is stored in other locations besides a register.

If the value is a first value that indicates the number of memory channels is a non-power of two number (conditional block 810, "yes" leg), then the control unit uses a first mapping to map memory requests to memory channels (block 815). Also, the control unit uses a first translation scheme for translating physical addresses to normalized addresses if the system has a non-power of two memory configuration (block 820). One example of a first mapping and a first translation scheme is described in further detail below in the discussion associated with method 900 (of FIG. 9).

If the value is a second value that indicates the number of memory channels is a power of two number (conditional block 810, "no" leg), then the control unit uses a second mapping to map memory requests to memory channels, wherein the second mapping is different from the first mapping (block 825). The control unit also uses a second translation scheme for translating physical addresses to normalized addresses if the system has a power of two memory configuration, wherein the second translation scheme is different from the first translation scheme (block 830). One example of a first mapping and a first translation scheme is described in the discussion associated with FIG. 2. After blocks 820 and 830, the control unit forwards memory requests to memory on the memory channels indicated by the selected mapping scheme and with normalized addresses translated from the physical addresses using the selected translation scheme (block 835). After block 835, method 800 ends.

Referring now to FIG. 9, one implementation of a method 900 for selecting a memory channel for a given physical address for a non-power of two memory configuration is shown. A control unit determines a number of active memory channels out of a total number of physical memory channels (block 905). For example, not all of the physical memory channels will be occupied and/or active for some memory subsystems. It is noted that "active memory channels" can also be referred to as "resident memory channels". In one implementation, the control unit is located within a memory controller. In other implementations, the control unit is placed in other locations The control unit reduces a ratio of the number of active memory channels to the total number of physical memory channels down to a first number to a second number (block 910). Reducing the ratio involves dividing each quantity by the greatest common factor. The ratio has been reduced when the numbers in the ratio are the smallest possible integers. For example, if there are 6 active memory channels and 8 physical memory channels, the control unit would reduce this ratio down to 3 to 4. If the ratio cannot be reduced, then the first number is equal to the number of active memory channels and the second number is equal to the total number of physical memory channels. It is noted that blocks 905-910 can be performed ahead of time, such as during system start-up. Accordingly, blocks 905-910 can be performed as part of method 900 or separately from method 900, depending on the implementation.

At a later point in time, the control unit receives a memory request (block 915). In response to receiving the memory request, the control unit determines if a first subset of physical address bits of the memory request are greater than or equal to the first number (block 920). In one implementation, the first subset of physical address bits are at least a portion of the bits which determine the mapping between physical address and memory channel. If the first subset of bits are greater than or equal to the first number (conditional block 925, "yes" leg), then the control unit calculates a third number which is equal to a second subset of physical address bits modulo the first number (block 930). In other words, the third number is equal to the remainder after the value represented by the second subset of physical address bits is divided by the first number. In one implementation, the second subset of physical address bits are physical address bits [43:16]. In other implementations, the second subset of physical address bits are other ranges of physical address bits depending on the block size, stride size, total address space size, and/or other factors. In another implementation, the modulo operation in block 930 is performed on a transform of the physical address bits rather than on the original physical address bits. As used herein, a "transform" of the physical address bits refers to a shifting of the address bits, mapping of the address bits to alternate values, or some other mathematical manipulation of the address bits.

Then, the control unit uses the third number concatenated with a third subset of physical address bits for selecting a memory channel for the memory request (block 935). It is noted that the control unit uses the third number instead of the first subset of physical address bits. The first subset of physical address bits would be used for selecting a memory channel in a conventional approach. In one implementation, the third subset of physical address bits are physical address bits [9:8]. Also, the control unit calculates a fourth number which is equal to the first subset of physical address bits shifted up (i.e., shifted left) by a fifth number, where the fifth number is calculated based on a size of the address space (block 940). In other words, the first subset of physical address bits are shifted left by a number of bits, with the number of bits equal to the fifth number. Effectively, this results in the first subset of bits being multiplied by two to the power of the fifth number. In another implementation, the control unit calculates the fourth number as being equal to a transform of the first subset of physical address bits shifted up by the fifth number. Next, the control unit calculates a first subset of normalized address bits as being equal to the second subset of physical address bits with upper bits being replaced by the first subset of physical address bits (block 945). Then, the control unit calculates a second subset of normalized address bits as being equal to a concatenation of a fourth subset of physical address bits and a fifth subset of physical address bits (block 950). In one implementation, the fourth subset of physical address bits are physical address bits [15:12] and the fifth subset of physical address bits are physical address bits [7:0]. In another implementation, the fourth subset of physical address bits are physical address bits [15:13]. In other implementations, the fourth and fifth subsets of physical address bits are other ranges of physical address bits depending on the block size, stride size, total address space size, and other factors.

If the first subset of bits are less than the first number (conditional block 925, "no" leg), then the control unit utilizes the conventional approach to select a memory channel and to generate a normalized address for the physical address of the memory request (block 955). After blocks 950 and 955, a memory controller accesses memory on the selected memory channel with the normalized address to fulfill the memory request (block 960). After block 960, method 900 ends.

Turning now to FIG. 10, another implementation of pseudocode 1000 for selecting a memory channel and translating a physical memory address to a normalized address is shown. It is assumed for the purposes of pseudocode 1000 that there are five active memory channels out of eight physical memory channels in the memory subsystem. Or said another way, it is assumed for pseudocode 1000 that the ratio of the number of active memory channels in the memory subsystem to the total number of physical memory channels, after reduction of the ratio, has a numerator of five and a denominator of eight. Accordingly, in this implementation, the first line of pseudocode 1000 checks to see if the physical address bits [12:10] are greater than or equal to 5, with 5 being the number of active memory channels.

The first line of pseudocode 1000 sets the remap_ID bits [2:0] equal to the sum of 3 multiplied by physical address bits [43:16] and the physical address bits [12:10] modulo 5. The second line of pseudocode 1000 sets the mod_ID bits [2:0] equal to the remap_ID bits [2:0] or to the physical address bits [12:10] depending on if the physical address bits [12:10] are greater than or equal to 5. In the third line of pseudocode 1000, the channel ID bits [4:0] are set equal to a concatenation of the mod_ID bits [2:0] and the physical address bits [9:8]. The channel ID bits [4:0] select on which memory channel to route a received memory request, with the maximum number of memory channels being 32 for this particular implementation. In other implementations, the number of channel ID bits can vary according to the maximum number of supported memory channels.

The bit-array upper_bits [43:16] is set equal to the value of the physical address bits [12:10] shifted up by the variable (addr_space−3). The bit-array lower_bits [43:16] is set equal to the output of a bitwise-AND operation between the of the physical address bits [43:16] and 1 less than the value of 1 shifted up by the variable (addr_space−3). The bits [43:11] of the normalized address are set equal to the result of a bitwise-OR operation between the bit-array upper_bits and the bit-array lower_bits or to the physical address bits [43:16] depending on whether the physical address bits [12:10] are greater than or equal to 5. The bits [10:0] of the normalized address are set equal to the concatenation of the physical address bits [15:13] and the physical address bits [7:0]. It should be understood that the example pseudocode 1000 is indicative of code that can be used in one particular implementation. The sizes of the various bit-arrays and the specific bits within the physical address that are used within pseudocode 1000 can vary for other implementations. The sizes of the various bit-arrays and the specific bits within the physical address that are used can vary according to the total address space, stride size, block size, number of active memory channels, number of physical memory channels, and so on In various implementations, program instructions of a software application are used to implement the methods and/or mechanisms described herein. For example, program instructions executable by a general or special purpose processor are contemplated. In various implementations, such program instructions are represented by a high level programming language. In other implementations, the program instructions are compiled from a high level programming language to a binary, intermediate, or other form. Alternatively, program instructions are written that describe the behavior or design of hardware. Such program instructions are represented by a high-level programming language, such as C. Alternatively, a hardware design language (HDL) such as Verilog is used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
one or more clients; and
a memory subsystem having a first ratio of active memory channels to total memory channels;
wherein the memory subsystem is configured to:
reduce the first ratio to a second ratio of a first number to a second number;
receive a memory request from a client of the one or more clients;
responsive to determining that a first subset of physical address bits of the memory request have a value that is greater than or equal to the first number:
calculate a third number based on a value corresponding to a second subset of physical address bits modulo the first number;
select a memory channel, of a plurality of memory channels, using a concatenation of the third number and a third subset of physical address bits; and
complete the memory request to the selected memory channel.

2. The system as recited in claim 1, wherein responsive to determining that the first subset of physical address bits of the memory request have a value that is greater than or equal to the first number, the control unit is further configured to:
calculate a fourth number which is based on the first subset of physical address bits shifted up by a fifth number, wherein the fifth number is calculated based on a size of an address space of the memory subsystem;
calculate a first subset of normalized address bits as being equal to the second subset of physical address bits with upper bits being replaced by the first subset of physical address bits;
calculate a second subset of normalized address bits as being equal to a concatenation of a fourth subset of physical address bits and a fifth subset of physical address bits; and complete the memory request to a normalized address on the selected memory channel, wherein the normalized address comprises the first subset of normalized address bits and the second subset of normalized address bits.

3. The system as recited in claim 2, wherein the memory subsystem has a non-power of two number of active memory channels.

4. The system as recited in claim 3, wherein the first subset of physical address bits are adjacent to the third subset of physical address bits.

5. The system as recited in claim 4, wherein the fourth subset of physical address bits are adjacent to the first subset of physical address bits.

6. The system as recited in claim 5, wherein the third subset of physical address bits are adjacent to the fifth subset of physical address bits.

7. The system as recited in claim 1, wherein the one or more clients are graphics engines, and wherein the memory request is generated as part of an application for rendering pixels to be displayed on a display.

8. A method comprising:
   determining, by a control unit of a first device, a number of active memory channels out of a total number of physical memory channels in a memory subsystem;
   reducing a ratio of the number of active memory channels to the total number of physical memory channels down from a first number to a second number;
   responsive to determining that a first subset of physical address bits of a received memory request are greater than or equal to the first number:
   calculating a third number which is based on a value corresponding to a second subset of physical address bits modulo the first number;
      selecting a memory channel, of a plurality of memory channels, using a concatenation of the third number and a third subset of physical address bits; and
      completing the memory request to the selected memory channel.

9. The method as recited in claim 8, wherein responsive to determining that the first subset of physical address bits of the memory request are greater than or equal to the first number, the method further comprising:
   calculating a fourth number which is based on the first subset of physical address bits shifted up by a fifth number, wherein the fifth number is calculated based on a size of an address space of the memory subsystem;
   calculating a first subset of normalized address bits as being equal to the second subset of physical address bits with upper bits being replaced by the first subset of physical address bits;
   calculating a second subset of normalized address bits as being equal to a concatenation of a fourth subset of physical address bits and a fifth subset of physical address bits; and
   completing the memory request to a normalized address on the selected memory channel, wherein the normalized address comprises the first subset of normalized address bits and the second subset of normalized address bits.

10. The method as recited in claim 9, wherein the memory subsystem has a non-power of two number of active memory channels.

11. The method as recited in claim 10, wherein the first subset of physical address bits are adjacent to the third subset of physical address bits.

12. The method as recited in claim 11, wherein the fourth subset of physical address bits are adjacent to the first subset of physical address bits.

13. The method as recited in claim 12, wherein the third subset of physical address bits are adjacent to the fifth subset of physical address bits.

14. The method as recited in claim 8, further comprising generating the memory request as part of an application for rendering pixels to be displayed on a display.

15. An apparatus comprising:
   a control unit; and
   a memory subsystem comprising a plurality of memory channels;
   wherein the control unit is configured to:
      determine a number of active memory channels out of a total number of physical memory channels in the memory subsystem;
      reduce a ratio of the number of active memory channels to the total number of physical memory channels down from a first number to a second number;
      responsive to determining a first subset of physical address bits of a received memory request are greater than or equal to the first number:
         calculate a third number which is based on a second subset of physical address bits modulo the first number;
         select a memory channel, of the plurality of memory channels, using a concatenation of the third number and a third subset of physical address bits; and
         complete the memory request to the selected memory channel.

16. The apparatus as recited in claim 15, wherein responsive to determining a first subset of physical address bits of the memory request are greater than or equal to the first number, the control unit is further configured to:
   calculate a fourth number which is based on the first subset of physical address bits shifted up by a fifth number, wherein the fifth number is calculated based on a size of an address space of the memory subsystem;
   calculate a first subset of normalized address bits as being equal to the second subset of physical address bits with upper bits being replaced by the first subset of physical address bits;
   calculate a second subset of normalized address bits as being equal to a concatenation of a fourth subset of physical address bits and a fifth subset of physical address bits; and
   complete the memory request to a normalized address on the selected memory channel, wherein the normalized address comprises the first subset of normalized address bits and the second subset of normalized address bits.

17. The apparatus as recited in claim 16, wherein the memory subsystem has a non-power of two number of active memory channels.

18. The apparatus as recited in claim 17, wherein the first subset of physical address bits are adjacent to the third subset of physical address bits.

19. The apparatus as recited in claim 18, wherein the fourth subset of physical address bits are adjacent to the first subset of physical address bits.

20. The apparatus as recited in claim 19, wherein the third subset of physical address bits are adjacent to the fifth subset of physical address bits.

* * * * *